United States Patent
Shimane et al.

(10) Patent No.: US 9,779,921 B2
(45) Date of Patent: Oct. 3, 2017

(54) SUBSTRATE PROCESSING APPARATUS

(71) Applicant: CANON ANELVA CORPORATION, Kawasaki-shi, Kanagawa-ken (JP)

(72) Inventors: Yoshimitsu Shimane, Hachioji (JP); Satoshi Uchino, Fuchu (JP); Susumu Akiyama, Tokyo (JP); Kazuaki Matsuo, Kawasaki (JP); Nobuo Yamaguchi, Tama (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 120 days.

(21) Appl. No.: 14/750,717

(22) Filed: Jun. 25, 2015

(65) Prior Publication Data
US 2015/0294845 A1 Oct. 15, 2015

Related U.S. Application Data

(63) Continuation of application No. PCT/JP2013/006997, filed on Nov. 28, 2013.

(30) Foreign Application Priority Data

Dec. 26, 2012 (JP) ................................. 2012-282467

(51) Int. Cl.
*C23C 14/34* (2006.01)
*H01J 37/34* (2006.01)
*H01J 37/32* (2006.01)

(52) U.S. Cl.
CPC .......... *H01J 37/3441* (2013.01); *C23C 14/34* (2013.01); *H01J 37/32477* (2013.01); (Continued)

(58) Field of Classification Search
CPC ............. H01J 37/3441; H01J 37/32477; H01J 37/32715; H01J 37/32733; H01J 37/3405; H01J 37/347
See application file for complete search history.

(56) References Cited

U.S. PATENT DOCUMENTS 5,108,569 A * 4/1992 Gilboa ................ C23C 14/0063
204/192.12
5,518,593 A * 5/1996 Hosokawa .......... C23C 14/3407
118/641
(Continued)

FOREIGN PATENT DOCUMENTS

CN 101235482 A 8/2008
JP 2004-018885 A 1/2004
(Continued)

OTHER PUBLICATIONS

Office Action (Notice of Preliminary Rejection) dated Sep. 5, 2016, by the Korean Patent Office in corresponding Korean Patent Application No. 10-2015-7019966 and an English Translation of the Office Action. (12 pages).
(Continued)

*Primary Examiner* — John Brayton
(74) *Attorney, Agent, or Firm* — Buchanan Ingersoll & Rooney PC

(57) ABSTRACT

An apparatus includes a process chamber, a substrate holder arranged in the process chamber, a first shield provided on the peripheral portion of the substrate holder, and a second shield provided inside the process chamber. The internal space of the process chamber is partitioned into an outer space and a process space to process the substrate, by at least the first shield, the second shield, and the substrate holder. The substrate holder can be driven along a driving direction perpendicular to a substrate holding surface. The length, in a direction parallel to the driving direction, of a minimum gap portion having a minimum size in a direction perpendicular to the driving direction between the first and second shields does not change even if the substrate holder is driven in the driving direction.

8 Claims, 6 Drawing Sheets

(52) U.S. Cl.
CPC .. *H01J 37/32715* (2013.01); *H01J 37/32733* (2013.01); *H01J 37/3405* (2013.01); *H01J 37/347* (2013.01)

(56) References Cited

U.S. PATENT DOCUMENTS

| | | | |
|---|---|---|---|
| 6,875,280 | B2 | 4/2005 | Ikeda et al. |
| 2008/0141942 | A1* | 6/2008 | Brown ............... C23C 14/564 118/723 R |
| 2008/0178801 | A1 | 7/2008 | Pavloff et al. |
| 2010/0224482 | A1* | 9/2010 | Yamaguchi ......... C23C 14/0036 204/192.15 |
| 2012/0152736 | A1 | 6/2012 | Yamaguchi et al. |
| 2014/0054164 | A1 | 2/2014 | Yamaguchi et al. |
| 2014/0261182 | A1 | 9/2014 | Nakazawa et al. |

FOREIGN PATENT DOCUMENTS

| | | |
|---|---|---|
| JP | 2008-261047 A | 10/2008 |
| JP | 2011-132580 A | 7/2011 |
| JP | 2012-132064 A | 7/2012 |
| JP | 2013-171273 A | 9/2013 |
| KR | 10-2010-0118586 A | 11/2010 |
| TW | 486748 B | 5/2002 |
| WO | WO 2010/061603 A1 | 6/2010 |
| WO | WO 2013/094200 A1 | 6/2013 |

OTHER PUBLICATIONS

Office Action dated Jun. 15, 2015, by the Taiwanese Patent Office in corresponding Taiwanese Patent Application No. 102147525, and an English Translation of the Office Action. (6 pages).

International Search Report (PCT/ISA/210) dated Feb. 25, 2014, by the Japanese Patent Office as the International Searching Authority for International Application No. PCT/JP2013/006997.

Written Opinion (PCT/ISA/237) dated Feb. 25, 2014, by the Japanese Patent Office as the International Searching Authority for International Application No. PCT/JP2013/006997.

Office Action (Notification of the First Office Action) dated Jun. 1, 2016, by the state intellectual property office of the People's Republic of China in corresponding Chinese Patent Application No. 201380068235.8, and an English Translation of the Office Action ( 9 pages).

* cited by examiner

F I G. 4A
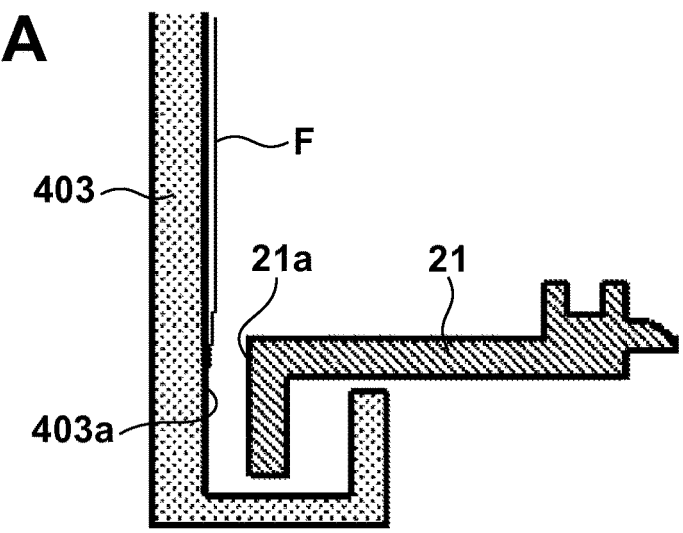
F I G. 4B
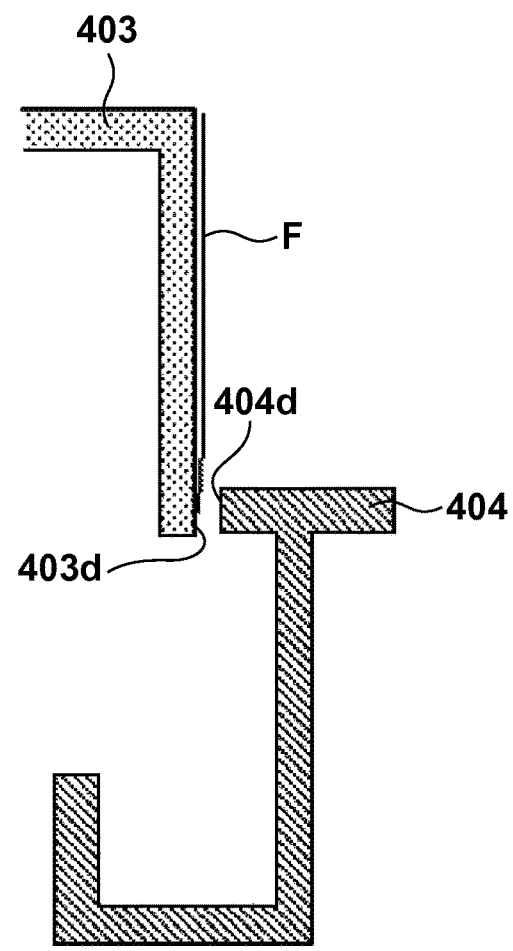

F I G. 5
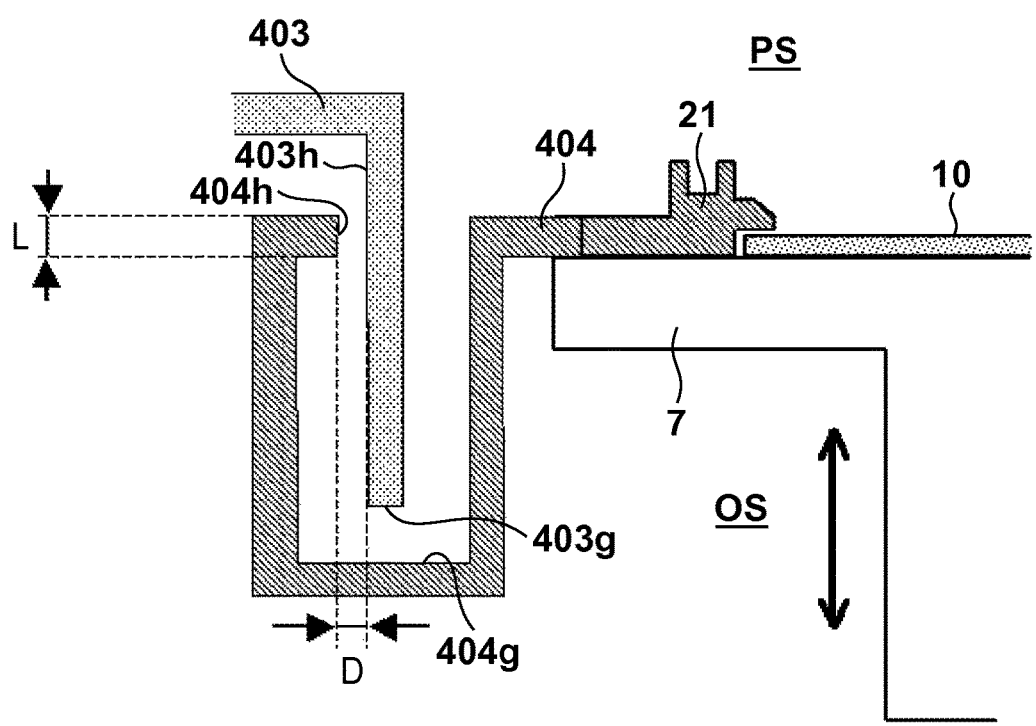

SUBSTRATE PROCESSING APPARATUS

This application is a continuation of International Patent Application No. PCT/JP2013/006997 filed on Nov. 28, 2013, and claims priority to Japanese Patent Application No. 2012-282467 filed on Dec. 26, 2012, the entire content of both of which is incorporated herein by reference.

TECHNICAL FIELD

The present invention relates to a substrate processing apparatus.

BACKGROUND ART

In a sputtering apparatus, if a thin film is formed on the inner wall of the process chamber, maintenance of the apparatus becomes difficult. Hence, an interchangeable protection shield is placed in the process chamber to protect the inner wall. The distance between a target and a substrate (to be referred to as a TS distance hereinafter) is known to affect the evenness of the thickness or quality of a formed film. In addition, the film thickness or film thickness distribution tends to gradually degrade as the target is gradually sputtered, and erosion progresses, as is known. Concerning these phenomena, changing the TS distance is a very effective way to improve or stabilize film quality.

The shield provided in the sputtering apparatus is formed from a plurality of divided shields to enable the change of the TS distance. Gaps are formed between the shield parts. To prevent a film from reaching the inner wall of the process chamber via the gaps, the gaps have a narrow path (labyrinth) structure (for example, PTL 1).

CITATION LIST

Patent Literature

PTL 1: Japanese Patent Laid-Open No. 2011-132580

SUMMARY OF INVENTION

Technical Problem

In a structure configured to introduce a process gas to the vicinity of the target, the process gas reaches a vacuum pump via the gaps between the shields. The gap structure is changed by TS adjustment. However, since the easiness of passing the process gas changes simultaneously, the pressure of the process gas in the vicinity of the target changes.

Additionally, if a structure configured to introduce a process gas to the vicinity of a vacuum pump is employed, and reactive sputtering in which a source gas is consumed by the target or in the vicinity of the target by a reaction is performed, the process gas flows to the vicinity of the target via the gaps between the shields. Hence, the pressure of the process gas similarly changes when the positional relationship between the target and the substrate is adjusted. In PTL 1, an exhaust path having a conductance much larger than a change in the conductance caused by a variation in the TS distance is formed, thereby reducing a change in the pressure of a process gas.

However, along with the rise of device functionality and the progress of micropatterning technologies, requirements for the reproducibility of film quality have become more strict. Hence, more precise pressure control is demanded. That is, there is a need of a sputtering apparatus in which the pressure in the process space changes less even when a position between a target and a substrate is adjusted.

Even in another substrate processing apparatus such as a CVD apparatus or an etching apparatus, a change in the pressure in the process space that occurs when a substrate holder is moved is required to be smaller.

It is an object of the present invention to provide a technique capable of suppressing a pressure change in a process space when a substrate holder is moved and advantageous in depositing a high-quality thin film.

Solution to Problem

According to one aspect of the present invention, there is provided a substrate processing apparatus comprising a process chamber, an exhaust unit configured to exhaust gas from the process chamber, a gas introduction unit configured to introduce a gas into the process chamber, a substrate holder configured to hold a substrate in the process chamber, a first shield provided on a peripheral portion of the substrate holder, and a second shield provided inside the process chamber, wherein an internal space of the process chamber is partitioned into an outer space and a process space to process the substrate by at least the first shield, the second shield, and the substrate holder, the substrate holder can be driven along a driving direction perpendicular to a substrate holding surface that holds the substrate, the first shield and the second shield are provided so as not to make a linear path from a center of the process space or a central axis of the substrate holder to the outer space exist, and a length, in a direction parallel to the driving direction, of a minimum gap portion having a minimum size in a direction perpendicular to the driving direction, out of a gap formed between the first shield and the second shield does not change even if the substrate holder is driven in the driving direction.

Advantageous Effects of Invention

According to the present invention, it is possible to provide a technique capable of suppressing a pressure change in a process space when a substrate holder is moved and advantageous in depositing a high-quality thin film.

BRIEF DESCRIPTION OF DRAWINGS

FIG. 4A is a view for explaining the first embodiment of the present invention;

FIG. 4B is a view for explaining the second embodiment of the present invention;

FIG. 5 is a view for explaining the third embodiment of the present invention;

DESCRIPTION OF EMBODIMENTS

Preferred embodiments of the present invention will now be described in detail with reference to the accompanying drawings. Note that the constituent elements described in the embodiments are merely examples. The technical scope of the present invention is determined by the scope of claims and is not limited by the following individual embodiments.

Figure 1:
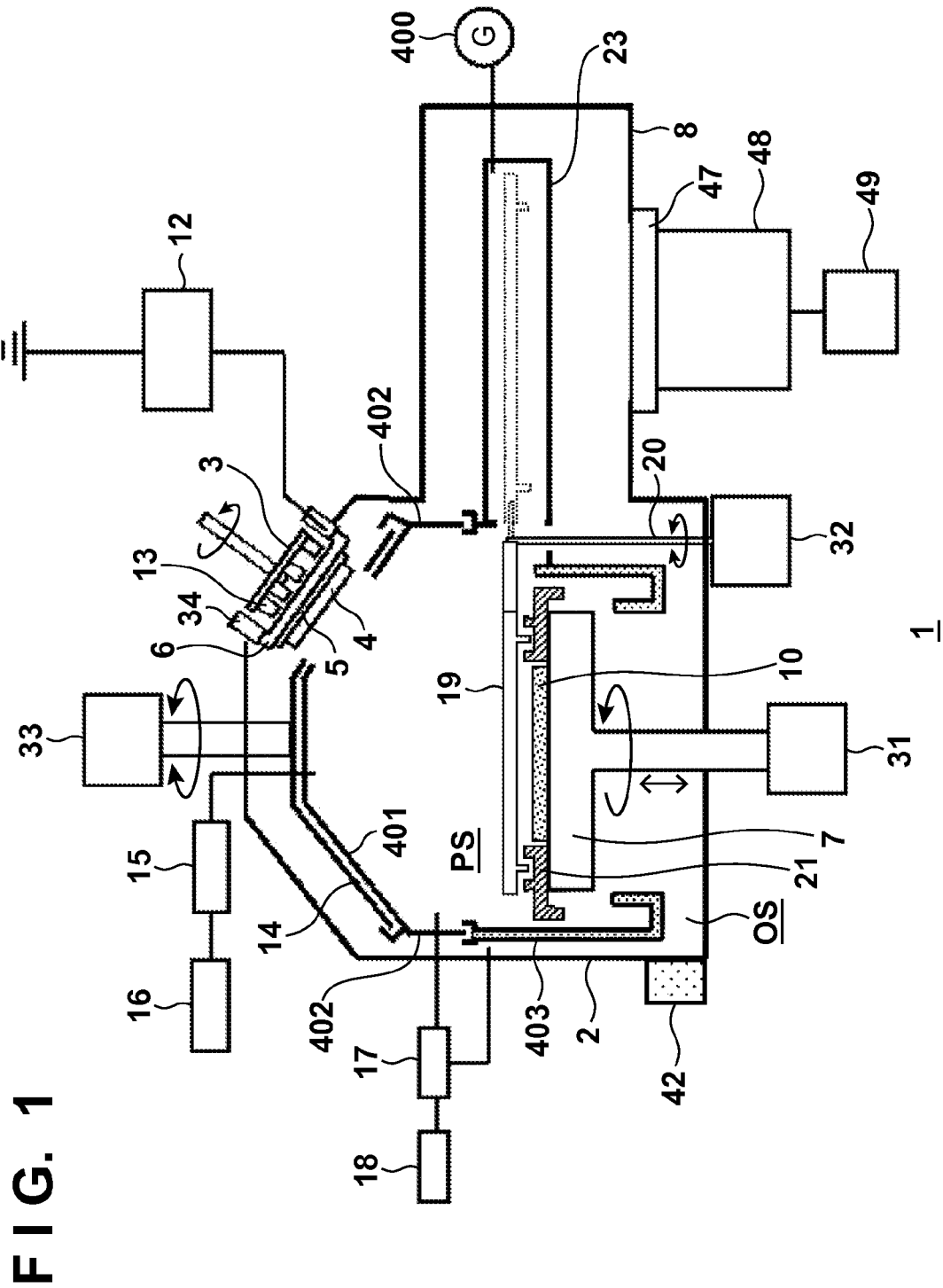
FIG. 1 is a view for explaining a sputtering processing apparatus as an example of a substrate processing apparatus according to the present invention.

The overall arrangement of a sputtering apparatus 1 will be described with reference to FIG. 1. FIG. 1 is a schematic view of the sputtering apparatus 1 according to this embodiment.

The sputtering apparatus 1 includes a process chamber 2 capable of evacuation, an exhaust chamber 8 connected to the process chamber 2 via an exhaust port, and an exhaust device that exhausts gas from the process chamber 2 via the exhaust chamber 8. The exhaust device includes a turbo-molecular pump 48. A dry-sealed vacuum pump 49 may be connected to the turbo-molecular pump 48 of the exhaust device. The exhaust device is provided under the exhaust chamber 8 to make the footprint (occupied area) of the entire apparatus as small as possible.

In the process chamber 2, a target holder 6 that holds a target 4 via a back plate 5 is provided. The center of the target holder 6 is arranged at a position offset with respect to the center position of a substrate holder 7 that holds a substrate 10 on a substrate holding surface (the center position of the substrate 10 held by the substrate holder 7). A target shutter 14 is arranged in the vicinity of the target holder 6. The target shutter 14 has a structure of a rotary shutter. The target shutter 14 functions as a block member that creates a close state (block state) in which the path between the substrate holder 7 and the target holder 6 is blocked or an open state (non-block state) in which the path is formed between the substrate holder 7 and the target holder 6. The target shutter 14 is provided with a target shutter driving mechanism 33 that opens/closes the target shutter 14.

The process chamber 2 also includes an inert gas introduction system 15 that introduces an inert gas (for example, argon) into the process chamber 2, a reactive gas introduction system 17 that introduces a reactive gas (for example, oxygen or nitrogen), and a pressure gauge 400 that measures the pressure in the process chamber 2.

An inert gas supply device (gas cylinder) 16 that supplies an inert gas is connected to the inert gas introduction system 15. The inert gas introduction system 15 can include a pipe configured to introduce an inert gas, a mass flow controller used to control the flow rate of the inert gas, and a valve used to block or start a gas flow. The inert gas introduction system 15 can further include a pressure-reducing valve, a filter, and the like as needed. The inert gas introduction system 15 has an arrangement capable of stably making a gas flow at a flow rate designated by a control device (not shown). The inert gas is supplied from the inert gas supply device 16, undergoes flow rate control in the inert gas introduction system 15, and is then introduced to the vicinity of the target 4.

A reactive gas supply device (gas cylinder) 18 that supplies a reactive gas is connected to the reactive gas introduction system 17. The reactive gas introduction system 17 can include a pipe configured to introduce a reactive gas, a mass flow controller used to control the flow rate of the inert gas, and a valve used to block or start a gas flow. The reactive gas introduction system 17 can further include a pressure-reducing valve, a filter, and the like as needed. The reactive gas introduction system 17 has an arrangement capable of stably making a gas flow at a flow rate designated by a control device (not shown). The reactive gas is supplied from the reactive gas supply device 18, undergoes flow rate control in the reactive gas introduction system 17, and is then introduced from a reactive gas introduction portion provided in a shield 402 into a process space PS.

The reactive gas introduction system 17 may be configured to introduce the reactive gas into an outer space OS arranged outside the process space PS partitioned by shields 401, 402, and 403, the substrate holder 7, the target holder 6 (back plate 5), and a shutter storage unit 23. In this case, the reactive gas can be introduced from the outer space OS into the process space PS via a gap between the shield 403 and the substrate holder 7. The reactive gas may be introduced into both the process space PS and the outer space OS.

The inert gas and the reactive gas are introduced into the process chamber 2, used to form a film, passed through the exhaust chamber 8, and exhausted by the turbo-molecular pump 48 and the dry-sealed vacuum pump 49 via an exhaust portion provided in the process chamber 2.

The inner surface of the process chamber 2 is electrically grounded. The ceiling shield 401 that is electrically grounded is provided on the inner surface of the process chamber 2 so as to cover a region of the inner surface of the ceiling portion of the process chamber 2 other than a region where the target holder 6 is arranged. In addition, the cylindrical shields 402 and 403 that are electrically grounded are provided on the inner surface of the process chamber 2. The ceiling shield 401 and the cylindrical shields 402 and 403 will also be referred to as shields hereinafter. A shield is a member that is formed separately from the process chamber 2 and can be exchanged periodically to prevent sputter particles from directly adhering to the inner surface of the process chamber 2 and protect the inner surface of the process chamber. The shields can be made of, for example, stainless steel or an aluminum alloy. If heat resistance is needed, the shields can be made of titanium or a titanium alloy. If heat resistance is not needed, aluminum may be selected as the material of the shields from the viewpoint of cost effectiveness and operability because aluminum is less expensive than titanium, and its a specific gravity is lower than that of stainless steel. Furthermore, since the shields are electrically grounded, a plasma generated in the process space PS can be stabilized. Out of the surfaces of each shield, at least the surface facing the process space PS is processed by sandblasting or the like so as to have very small unevenness. This can make a film adhered to the shield hard to peel off and reduce particles generated by peel-off. In addition to blasting, metal spraying or the like may be performed to form a thin metal film on the surface of the shield. In this case, spraying is more expensive than only blasting. However, at the time of maintenance where the shield is detached, and an adhered film is peeled off, the adhered film can be peeled off together with the sprayed film. In addition, the sprayed film has the effect of relaxing stress of the sputtered film and preventing it from peeling off.

The exhaust chamber 8 connects the process chamber 2 and the turbo-molecular pump 48. A main valve 47 that blocks the path between the sputtering apparatus 1 and the turbo-molecular pump 48 at the time of maintenance is provided between the exhaust chamber 8 and the turbo-molecular pump 48.

A magnet 13 used to implement magnetron sputtering is disposed behind the target 4. The magnet 13 is held by a magnet holder 3 and can be rotated by a magnet holder rotating mechanism (not shown). To even erosion of the target, the magnet 13 rotates during discharge. A power supply 12 that applies power for sputtering discharge is connected to the target holder 6. When the power supply 12 applies a voltage to the target holder 6, discharge starts, and sputter particles are deposited on the substrate.

In this embodiment, the sputtering apparatus 1 shown in FIG. 1 includes a DC power supply. However, the present invention is not limited to this, and the sputtering apparatus 1 may include, for example, an RF power supply. When an RF power supply is used, a matching device needs to be placed between the power supply 12 and the target holder 6.

The target holder 6 is insulated from the process chamber 2 of the ground potential by an insulator 34. In addition, the target holder 6 is made of a metal such as Cu and therefore serves as an electrode when DC or RF power is applied to it. The target holder 6 has a refrigerant channel (not shown) in it, and can thus be cooled by a refrigerant such as cooling water supplied from a duct (not shown). The target 4 is made of a material to deposit on the substrate 10. A high purity material is preferable because it is relevant to the purity of a film.

The back plate 5 placed between the target 4 and the target holder 6 is made of a metal such as Cu and holds the target 4.

The target shutter 14 is placed in the vicinity of the target holder 6 so as to cover the target holder 6. The target shutter 14 functions as a block member that creates a close state in which the path between the substrate holder 7 and the target holder 6 is blocked or an open state in which the path is formed between the substrate holder 7 and the target holder 6.

A block member (to be also referred to as a cover ring hereinafter) 21 having a ring shape is provided on the surface of the substrate holder 7 at the outer edge (peripheral portion) of a portion to hold the substrate 10. The cover ring 21 prevents sputter particles from adhering to regions other than the deposition surface of the substrate 10 held on the substrate holder 7 by the substrate holder 7. The regions other than the deposition surface include not only the upper surface of the substrate holder 7 covered by the cover ring 21 but also the side and lower surfaces of the substrate 10. On the other hand, it may be necessary to deposit a film even on the peripheral portion of a substrate because of restrictions in the manufacturing step of a semiconductor device. In this case, the opening of the cover ring 21 is made equal to or larger than the size of the substrate. This can prevent deposition on the substrate holder 7 while depositing a film on the entire surface of the substrate. The cover ring 21 is formed to be interchangeable, like other shields. Hence, the cover ring 21 is appropriately interchanged, or cleaned and reused.

The substrate holder 7 is provided with a substrate holder driving mechanism 31 that moves the substrate holder 7 in the vertical direction or rotates it at a predetermined speed. The substrate holder 7 is configured to be drivable by the substrate holder driving mechanism 31 in a driving direction perpendicular to the substrate holding surface while maintaining the vacuum state in the internal space of the process chamber 2. With this structure, the TS distance can be changed. The substrate holder driving mechanism 31 includes a bellows used to drive the substrate holder 7 in the driving direction while maintaining the vacuum state in the internal space of the process chamber 2, a magnetic fluid seal used to rotate the substrate holder 7 while maintaining the vacuum state, motors configured to rotate the substrate holder 7 and move it in the vertical direction, and a sensor used to measure the position of the substrate holder 7. The position and rotation of the substrate holder 7 can be controlled by a control device (not shown).

A substrate shutter 19 is arranged in the vicinity of the substrate 10 between the substrate holder 7 and the target holder 6. The substrate shutter 19 is supported by a substrate shutter support member 20 so as to cover the surface of the substrate 10. A substrate shutter driving mechanism 32 rotates and translates the substrate shutter support member 20, thereby inserting the substrate shutter 19 between the target 4 and the substrate 10 at a position near the surface of the substrate 10 (close state). When the substrate shutter 19 is inserted between the target 4 and the substrate 10, the path between the target 4 and the substrate 10 is blocked. When the substrate shutter driving mechanism 32 operates to retract the substrate shutter 19 from the position between the target holder 6 (target 4) and the substrate holder 7 (substrate 10), the path is formed between the target holder 6 (target 4) and the substrate holder 7 (substrate 10) (open state). The substrate shutter driving mechanism 32 opens/closes the substrate shutter 19 to create the close state in which the path between the substrate holder 7 and the target holder 6 is blocked or an open state in which the path is formed between the substrate holder 7 and the target holder 6. In the open state, the substrate shutter 19 is stored in the shutter storage unit 23. If the shutter storage unit 23 serving as a place to retract the substrate shutter 19 fits in the conduit of the exhaust path up to the turbo-molecular pump 48 used for high vacuum exhaust, as shown in FIG. 1, the area of the apparatus can suitably be reduced.

The substrate shutter 19 can be made of stainless steel or an aluminum alloy. If heat resistance is needed, the substrate shutter 19 can be made of titanium or a titanium alloy. Out of the surfaces of the substrate shutter 19, at least the surface facing the target 4 is processed by sandblasting or the like so as to have very small unevenness. This can make a film adhered to the substrate shutter 19 hard to peel off and reduce particles generated by peel-off. Note that in addition to blasting, metal spraying or the like may be performed to form a thin metal film on the surface of the substrate shutter 19. In this case, spraying is more expensive than only blasting. However, at the time of maintenance where the substrate shutter 19 is detached, and an adhered film is peeled off, the adhered film can advantageously be peeled off together with the sprayed film. In addition, the sprayed film has the effect of relaxing stress of the sputtered film and preventing it from peeling off.

Sputtering is sometimes performed while keeping the substrate shutter closed to clean the target surface or stabilize the state in the vacuum chamber by adhering a thin film to the inner surfaces of the shields. At this time, even in a limited amount, a thin film deposited on the surface of the substrate holder 7 may contaminate the lower surface of the substrate conveyed to the substrate holder 7, and thus deteriorate the performance of a semiconductor device formed by processing the substrate or contaminate the apparatus of the next process. Hence, when the substrate shutter 19 is in the close state, the cover ring 21 and the substrate shutter form a so-called narrow path (labyrinth) where they fit in each other in a non-contact state, thereby preventing film deposition on the substrate holder.

(First Embodiment)

Shields in the neighborhood of a substrate holder 7 will be described with reference to FIG. 2. A substrate 10 is arranged on the substrate holder 7. In addition, a cover ring 21 is placed at the peripheral portion of the substrate holder. A shield 403 is attached to a process chamber 2 while forming a predetermined gap with respect to the cover ring 21. The substrate holder 7 can move in a direction perpendicular to the substrate holding surface to adjust the TS distance. Along with this movement, the cover ring 21 also moves together with the substrate holder 7. On the other hand, since the shield 403 is fixed to the process chamber 2, the position of the shield 403 does not change along with the movement of the substrate holder 7.

A process gas introduced into the vacuum chamber 2 is exhausted from a process space PS or introduced into the process space PS via the gap between the shield 403 and the cover ring 21. An index quantitatively representing the easiness of exhaust or introduction is a conductance. When exhausting the process gas from the process space PS, the process gas is exhausted via a path 100 indicated by the arrow. The exhaust conductance when exhausting a gas from the process space PS to an outer space OS via the periphery of the substrate holder 7 changes depending on the form of the gap formed between the cover ring 21 and the shield 403. The cover ring 21 includes, at its peripheral portion, a cylindrical portion 210 extending in a direction parallel to the fall direction of the substrate holder 7. Out of the gap between the cover ring 21 and the shield 403, the gap formed between an outer side surface 21a of the cylindrical portion 210 of the cover ring 21 and an inner side surface 403a of a portion (cylindrical portion) of the shield 403 facing the outer side surface 21a (size in a direction perpendicular to the driving direction of the substrate holder 4 by a substrate holder driving mechanism 31) has the shortest distance. In the first embodiment, the gap formed between the outer side surface 21a of the cylindrical portion 210 of the cover ring 21 and the inner side surface 403a of the shield 403 is the minimum gap portion. The size of the minimum gap portion is called a minimum gap D. The conductance in the path 100 largely depends on the minimum gap D and a length L of the minimum gap portion in the driving direction of the substrate holder 7 (direction perpendicular to the substrate holding surface).

The conductance in the path 100 can be regarded as the series connection of a conductance C1 formed from the minimum gap D and the length L and a conductance C2 formed from another portion of the shield 403, the cover ring 21, and the substrate holder 7. The composite conductance of the conductances connected in series on the exhaust path is given by $$C=1/((1/C1)+(1/C2)) \qquad (1)$$

C is the composite conductance. As is apparent from equation (1), if C2 is sufficiently large, the composite conductance C almost equals C1.

In a portion other than the minimum gap portion forming the minimum gap D, C2 is sufficiently large because the gap between the shield 403 and the cover ring 21 and the substrate holder 7 is large. Additionally, the apparatus is configured such that even if the substrate holder 7 is driven in the vertical direction, the length L of the minimum gap portion forming the minimum gap D between the outer side surface 21a of the cover ring 21 and the inner side surface 403a of the shield 403 out of the gap formed between the cover ring 21 and the shield 403 does not change. Even if the substrate holder 7 moves in the vertical direction, C1 rarely changes. Hence, when the substrate holder 7 moves in the vertical direction, a change in the composite conductance formed from C1 and C2 can be suppressed small.

Figure 2:
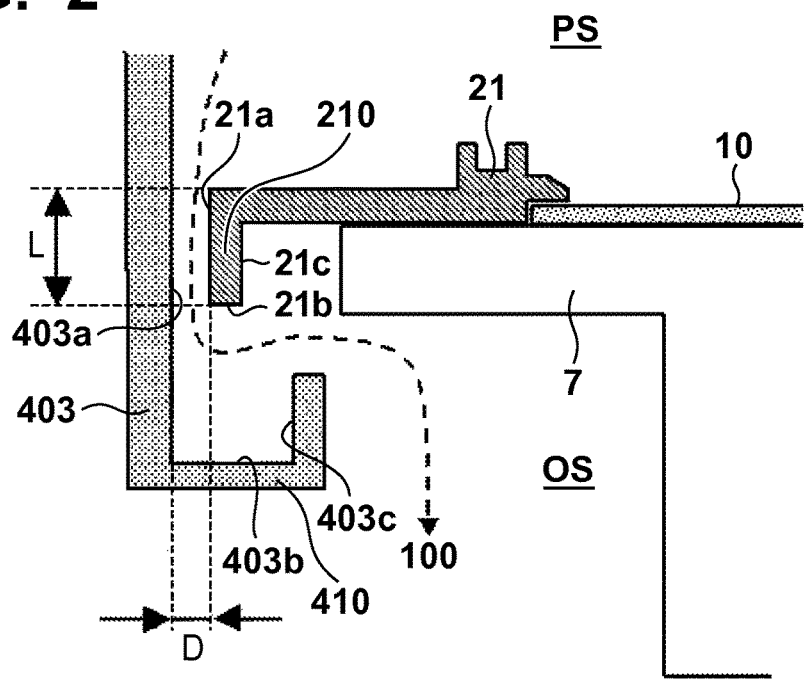
FIG. 2 is a view for explaining the first embodiment of the present invention.

To prevent the length L of the minimum gap portion forming the minimum gap D from changing even if the substrate holder 7 moves in the vertical direction, in the example shown in FIG. 2, the substrate holder 7 is moved in the vertical direction within the range in which the distance between an end face (lower surface) 21b of the cylindrical portion 210 of the cover ring 21 and a bottom surface 403b and an inner side surface 403c of a concave portion 410 of the shield 403 does not become shorter than the minimum gap D. In addition, the shapes and positions of the shield 403 and the cover ring 21 are designed so the distance between an inner side surface 21c of the cylindrical portion 210 of the cover ring 21 and the inner side surface 403c of the concave portion 410 of the shield 403 does not become shorter than the minimum gap D when the substrate holder 7 moves downward. Alternatively, the substrate holder 7 needs to be prohibited from moving downward up to a position where the inner side surface 21c and the inner side surface 403c face each other. However, this does not apply to a case where a deposition process on the substrate is not performed, and a change in the conductance does not affect the processing characteristic of the substrate, for example, when loading/unloading the substrate.

In the first embodiment, on a section taken along a plane passing through the central axis of the substrate holder 7, the distal end of the shield 403 bends in a direction from the periphery toward the inside of the substrate holder 7 and further bends toward the cover ring 21, thereby forming the concave portion 410. On the section taken along the plane passing through the central axis of the substrate holder 7, the distal end of the cover ring 21 bends in the fall direction of the substrate holder 7 so as to form the cylindrical portion 210. As described above, in the first embodiment, there exists no linear path from the center of the process space PS (or the central axis of the substrate holder 7) to the outer space OS. Many of sputter particles that have entered in the gap between the outer side surface 21a and the inner side surface 403a facing the outer side surface 21a strike the bottom surface 403b of the concave portion 410. This can suppress the sputter particles from dispersing from the process space PS to the outer space OS.

The outer side surface 21a of the cylindrical portion 210 of the cover ring 21 is parallel to the inner side surface 403a of the shield 403. It is therefore possible to increase the length L of the minimum gap portion forming the minimum gap D in the driving direction of the substrate holder 7. When the length L is long, the conductance of the minimum gap portion forming the minimum gap D becomes smaller, and C2 in equation (1) described above becomes large with respect to C1. Hence, a change in the conductance caused by the vertical movement of the substrate holder 7 can easily be reduced.

Such a structure for suppressing a change in the conductance is particularly effective in a structure that introduces a reactive gas into the process space PS via the outer space OS and forms a film on the substrate by reactive sputtering. When introducing a reactive gas into the outer space OS, the reactive gas is introduced into the process space PS via the gap between the shield 403 and the cover ring 21. This is because if the conductance of the gap to pass the reactive gas changes, the amount of the gas contributing to the reaction with sputtered particles changes, resulting in difficulty in obtaining a desired film.

In the first embodiment, the process space PS is partitioned by at least the substrate holder 7, the cover ring 21 provided on the substrate holder 7, and the ceiling shield 403. The process space PS may be partitioned by at least one of a target 4, a back plate 5, a shutter storage unit 23, and the like in addition to these members. The cover ring 21 provided on the periphery of the substrate holder 7 is configured to suppress a change in the conductance of the gap between the cover ring 21 and the shield 403 provided inside the process chamber 2 when moving in accordance with driving of the substrate holder 7. The process space PS can be partitioned by at least the shield 403 and the cover ring 21.

(Second Embodiment)

Figure 3:
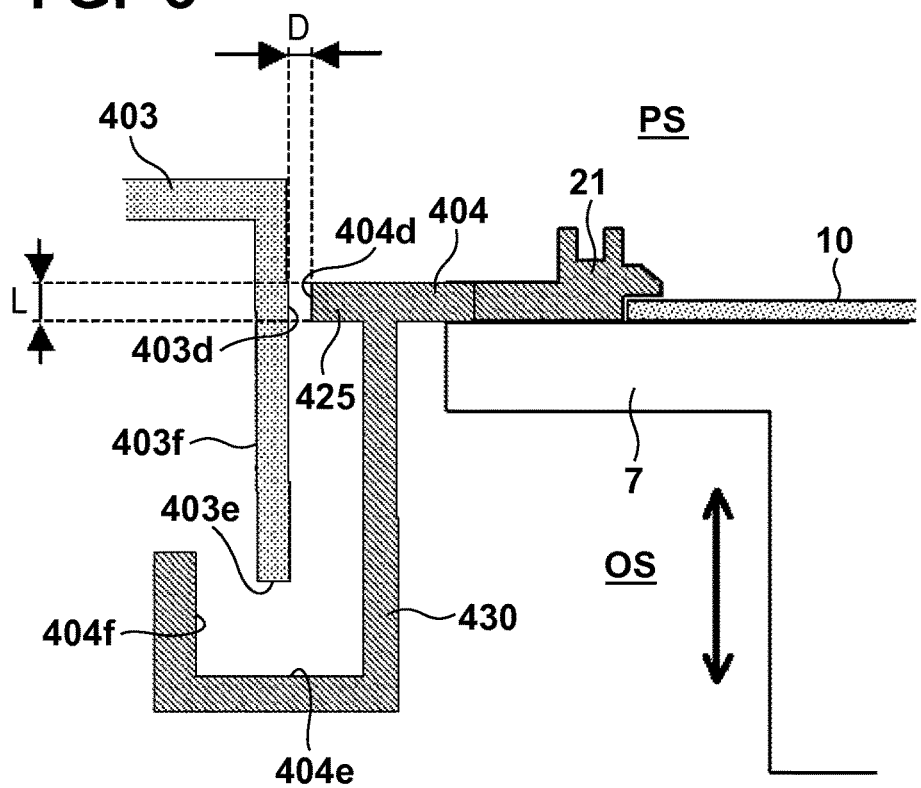
FIG. 3 is a view for explaining the second embodiment of the present invention.

FIG. 3 shows the second embodiment of the present invention. In the second embodiment, a shield 404 is provided outside a cover ring 21, and an exhaust path is formed by the shield 404 and a shield 403. If the cover ring 21 and the shield 404 are separate members, restrictions in designing the cover ring 21 can be reduced. For example, the shield 404 and the cover ring 21 can be manufactured using different materials. The cover ring 21 and the shield 404 may be integrated, as a matter of course.

In the second embodiment, the distance between an outer side surface 403d of the shield 403 and a surface 404d of a projecting portion of the shield 404, which projects to the side of the shield 403, corresponds to a minimum gap D out of the gap formed between the shields 403 and 404. A length L of the minimum gap portion forming the minimum gap D affects the conductance most. However, even if a substrate holder 7 moves in the vertical direction, the length L of the minimum gap portion forming the minimum gap D does not change. It is therefore possible to suppress a change in the conductance of the exhaust path formed by the shields 404 and 403.

In the second embodiment, to define the minimum gap D, the shield 404 includes a projecting portion 425 that projects toward the shield 403, and on the other hand, includes a cylindrical portion 430 extending in a direction parallel to the fall direction of the substrate holder 7. The cylindrical portion 430 extends up to a position lower than the lower end of the shield 403 and then bends in a direction from the inside to the periphery of the substrate holder 7. The distal end further bends in the rise direction of the substrate holder 7. Since the distal end of the shield 404 bends so as to surround the distal end of the shield 403, there exists no linear path from the center of a process space PS (or the central axis of the substrate holder 7) to an outer space OS.

Another effect of the second embodiment will be described with reference to FIGS. 4A and 4B. Each of FIGS. 4A and 4B shows a state in which the substrate holder 7 is moved downward as much as possible within the range where a linear path from the center of the process space PS (or the central axis of the substrate holder 7) to the outer space OS does not exist. Members other than the members forming the main exhaust path are not illustrated in FIGS. 4A and 4B.

Before forming a film on a substrate by sputtering, to suppress gas emission from the surfaces of members arranged inside a process chamber 2, a method of forming a sputtered film mainly on the surfaces of members facing the process space PS and the surfaces of members near in the vicinity of the process space PS can be employed. Gas emission occurs even from the cover ring 21 and the shields 403 and 404 that form the exhaust path. Hence, it is preferable to form a sputtered film in advance on the surfaces of these members close the process space PS.

FIG. 4A is a view showing a state in which the substrate holder 7 is moved downward as much as possible to make the cover ring 21 and the shield 403 close to each other in the first embodiment. When a target 4 is sputtered in this state, a film F is formed mainly in a region of a surface 403a of the shield 403 facing the target 4.

FIG. 4B is a view showing a state in which the substrate holder 7 is moved downward as much as possible in the second embodiment while maintaining a state in which a linear path from the center of the process space PS (or the central axis of the substrate holder 7) to the outer space OS does not exist. In the second embodiment, since the shield 404 can be moved downward to the vicinity of the distal end of the shield 403, the film F can be formed almost on the entire surface of the surface 403d of the shield 403. For this reason, the gas emitted from the shield 403 is reduced at the time of a deposition process on a substrate 10, and a high-quality film can be deposited.

The surface 404d of the shield 404 is the outer side surface of a plane-like portion arranged outside the cover ring 21. If the minimum gap D is formed by the surface of one shield and the side surface of the plate-like portion of the other shield, the minimum gap D can easily be formed over the length L. It is therefore possible to reduce the machine difference of the conductance between apparatuses.

In the second embodiment as well, the apparatus is configured not to change the minimum gap D when actually performing a deposition process on the substrate. That is, the apparatus is configured such that the distance between a surface 403f and a surface 404f becomes larger than the minimum gap D, and the distance between a surface 403e and a surface 404e does not become smaller than the minimum gap D when the substrate holder 7 moves downward.

(Third Embodiment)

FIG. 5 shows the third embodiment of the present invention. In the third embodiment, a shield 404 bends so as to surround the distal end of a shield 403, and the distal end of the shield 404 further bends toward the shield 403. The apparatus is configured such that the gap between a surface 404h of the bending portion facing the shield 403 and a surface 403h of the shield 403 facing the bending portion becomes a minimum gap D.

Figure 6A:
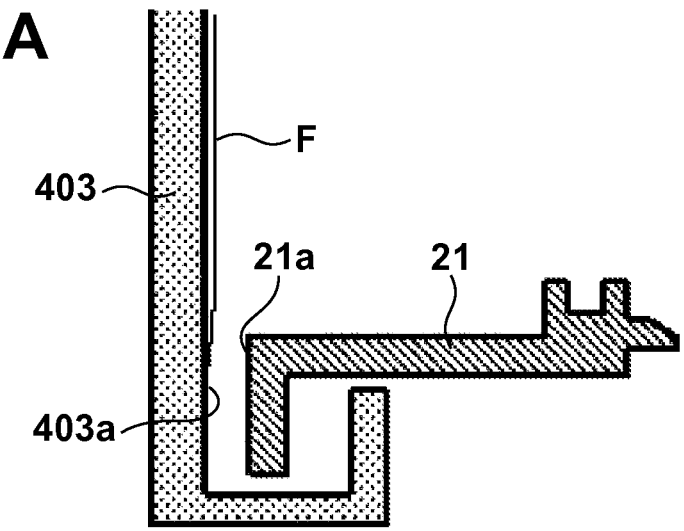
FIG. 6A is a view for explaining the first embodiment of the present invention.
Figure 6B:
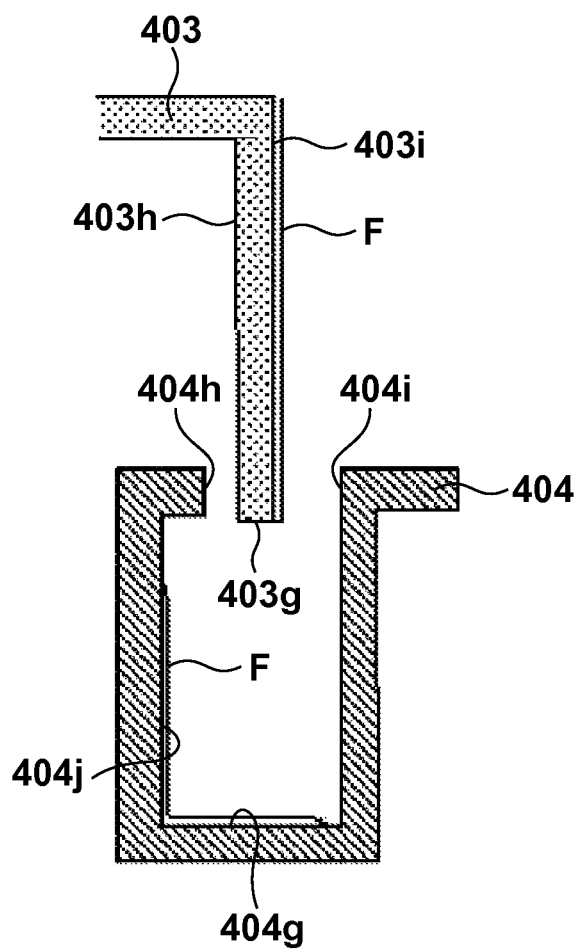
FIG. 6B is a view for explaining the third embodiment of the present invention.

The effect of the third embodiment will be described with reference to FIGS. 6A and 6B. Each of FIGS. 6A and 6B shows a state in which a substrate holder 7 is moved downward as much as possible within the range where a linear path from the center of a process space PS (or the central axis of the substrate holder 7) to an outer space OS does not exist. Members other than the members forming the main exhaust path are not illustrated in FIGS. 6A and 6B.

Before forming a film on a substrate by sputtering, to suppress gas emission from the surfaces of members arranged inside a process chamber 2, a method of forming a sputtered film mainly on the surfaces of members facing the process space PS and the surfaces of members near in the vicinity of the process space PS can be employed. Gas emission occurs even from a cover ring 21 and the shields 403 and 404 that form the exhaust path. Hence, it is preferable to form a sputtered film in advance on the surfaces of these members close the process space PS.

FIG. 6A is a view showing a state in which the substrate holder 7 is moved downward as much as possible to make the cover ring 21 and the shield 403 close to each other in the first embodiment. When a target 4 is sputtered in this state, a film F is formed mainly in a region of a surface 403a of the shield 403 facing the target 4.

FIG. 6B is a view showing a state in which the substrate holder 7 is moved downward as much as possible in the third embodiment while maintaining a state in which a linear path from the center of the process space PS (or the central axis of the substrate holder 7) to the outer space OS does not exist. In the third embodiment, since the surface 403h and the surface 404h form the minimum gap D, the gap between a surface 403i and a surface 404i can be made larger than the minimum gap D. For this reason, sputter particles readily adhere to the lower end of the surface 404*i* or a surface 404*j* and a surface 404*g*, and it is therefore possible to further reduce gas emission from the shield surfaces, as compared to the second embodiment.

In the third embodiment as well, the apparatus is configured not to change the minimum gap D when actually performing a deposition process on the substrate. That is, the apparatus is configured such that the distance between a surface 403*i* and the surface 404*i* becomes larger than the minimum gap D, and the distance between a surface 403*g* and the surface 404*g* does not become smaller than the minimum gap D when the substrate holder 7 moves downward.

(Fourth Embodiment)

Figure 7:
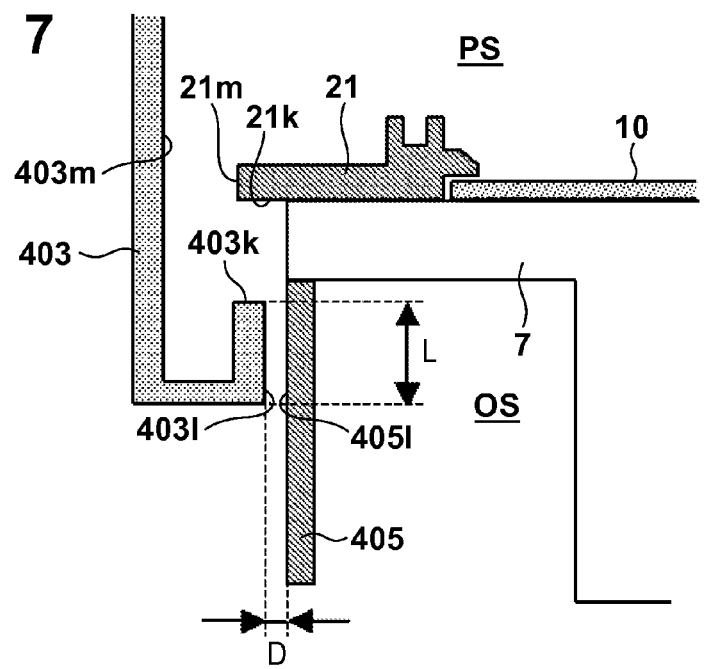
FIG. 7 is a view for explaining the fourth embodiment of the present invention.

FIG. 7 shows the fourth embodiment of the present invention. In the fourth embodiment, a shield 405 is provided at an end of a substrate holder 7 and extends in the fall direction of the substrate holder 7. On the other hand, the distal end of a shield 403 extends toward the substrate holder 7 (shield 405). The gap between the shield 405 and the bending portion of the distal end of the shield 403 is a minimum gap D. The apparatus is configured such that the distal end of the shield 403 extends to the side of the substrate holder 7 with respect to the distal end of a cover ring 21, and the shield 403 prevents a linear path from the center of a process space PS (or the central axis of the substrate holder 7) to an outer space OS from existing.

In the fourth embodiment, the distance between a surface 21*m* and a surface 403*m* is larger than the gap between a surface 403*l* and a surface 405*l* that is the minimum gap D. It is therefore possible to widely deposit a film on the surface of the shield 403 in a deposition process onto a shield surface, which is performed before a deposition process on a substrate. In addition, since the cover ring 21 and the shield 405 are formed from separate members, and a film is greatly deposited on the shield 403 and the cover ring 21 but hardly adheres to the shield 405, the exchange period of the shield 405 can be prolonged to facilitate maintenance.

In the fourth embodiment, the shield 405 is provided on the substrate holder 7. However, a portion extending in the fall direction of the substrate holder 7 may be formed at the periphery of the substrate holder 7, and the cover ring 21 and the shield 405 may be integrated.

EXAMPLE 1

Figure 8:
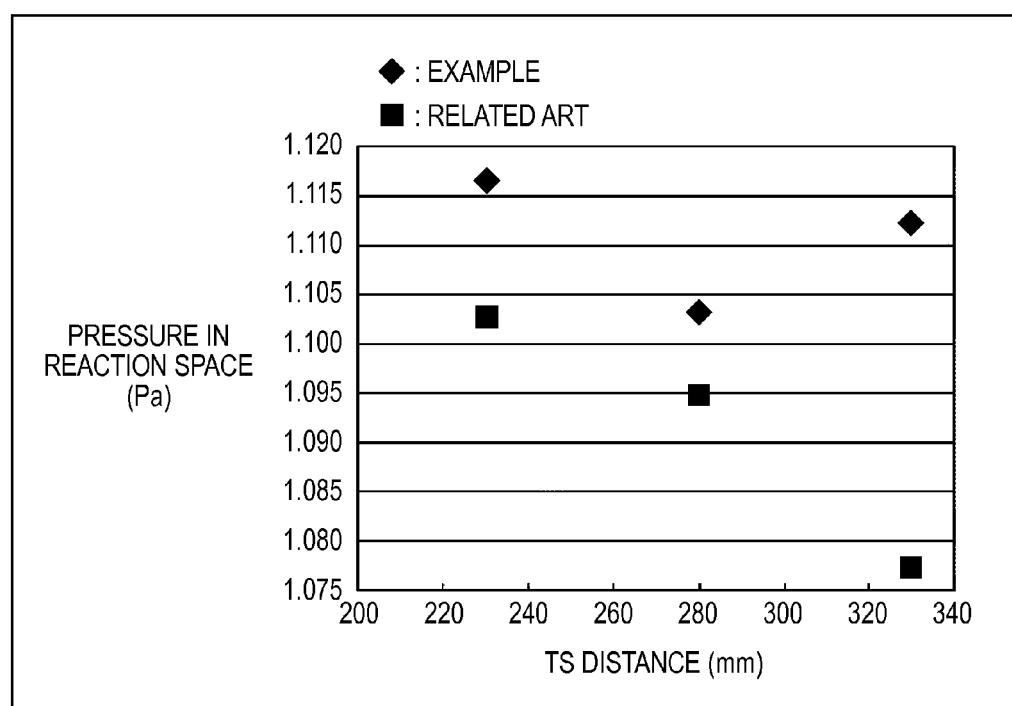
FIG. 8 is a view for explaining an example of the first embodiment of the present invention.

An example of the first embodiment of the present invention will be described with reference to FIG. 8. Referring to FIG. 8, the relationship to the TS distance was measured concerning the TS distance and the pressure in the shield when the minimum gap D was 6 mm, and the length L was 20 mm. As a comparative example, similar measurement was done for a sputtering apparatus described in PTL 1 in which the shield structure in the vicinity of the substrate holder changes along with a change in the TS distance. Graph 1 shows the result. In the experiments, Ar was introduced in the shield at 100 sccm, and the pressure in the shield was measured by a diaphragm type vacuum gauge at three positions corresponding to TS distances of 230 mm, 280 mm, and 330 mm. In the related art, the pressure changed from 1.103 Pa to 1.077 Pa. In the present invention, however, the change was suppressed within the range of 1.116 Pa to 1.104 Pa, as can be seen.

Note that in the embodiments, in addition to the effect of suppressing the change in the pressure in the shield, the effect of decreasing the number of parts of the sputtering apparatus can also be obtained because a part is shared as the cover ring and the part to limit the conductance.

Note that in the above-described embodiments, an example in which the substrate holder is driven in the direction perpendicular to the substrate holding surface has been explained. However, the present invention is not limited to this, and the substrate holder may be driven in a direction including not only a component in the direction perpendicular to the substrate holding surface but also a component in the planar direction of the substrate holding surface. In any case, when the substrate holder is driven in the direction including the component in the direction perpendicular to the substrate holding surface, the driving-direction length L of the portion having the minimum gap D between shields in the direction perpendicular to the driving direction does not change along with the driving of the substrate holder.

In the above-described embodiments, an example in which the substrate processing apparatus is a sputtering apparatus has been explained. However, the present invention is also usable for any other apparatus that needs to move the substrate holder in the vertical direction. For example, the present invention is applicable to a CVD apparatus or etching apparatus.

REFERENCE SIGNS LIST

1 . . . sputtering apparatus
2 . . . process chamber
3 . . . magnet holder
4 . . . target
5 . . . back plate
6 . . . target holder
7 . . . substrate holder
8 . . . exhaust chamber
10 . . . substrate
12 . . . power supply
13 . . . magnet
14 . . . target shutter
15 . . . inert gas introduction system
16 . . . inert gas supply device
17 . . . reactive gas introduction system
18 . . . reactive gas supply device
19 . . . substrate shutter
20 . . . substrate shutter support member
21 . . . cover ring
23 . . . shutter storage unit
31 . . . substrate holder driving mechanism
32 . . . substrate shutter driving mechanism
33 . . . target shutter driving mechanism
34 . . . insulator
42 . . . gate valve
47 . . . main valve
48 . . . turbo-molecular pump
49 . . . dry-sealed vacuum pump

The invention claimed is:

1. A substrate processing apparatus comprising:
a process chamber;
an exhaust unit configured to exhaust gas from the process chamber;
a gas introduction unit configured to introduce a gas into the process chamber;
a substrate holder having a substrate holding surface configured to hold a substrate in the process chamber, the substrate holder being capable of being driven along a driving direction perpendicular to the substrate holding surface;

a first shield provided on a peripheral portion of the substrate holder; and a second shield provided inside the process chamber, wherein the first shield includes, at a peripheral portion thereof, a cylindrical portion extending in a direction parallel to the driving direction, and the second shield includes a concave portion, an internal space of the process chamber is partitioned into an outer space and a process space to process the substrate by at least the first shield, the second shield, and the substrate holder, a relative position of the first shield and the second shield changes when the substrate holder is driven in the driving direction, the first shield and the second shield are provided so as not to make a linear path from a center of the process space to the outer space exist, the first shield and the second shield form a gap therebetween, the gap including a minimum gap portion having a minimum size in a direction perpendicular to the driving direction, the minimum gap portion being formed by an outer side surface of the cylindrical portion of the first shield and an inner side surface of the second shield, a length of the minimum gap portion in the direction parallel to the driving direction does not change when the substrate holder is driven in the driving direction and the relative position of the first shield and the second shield changes, and the substrate holder is driven in the driving direction within a range in which an inner side surface of the cylindrical portion of the first shield does not face an inner side surface of the concave portion of the second shield.

2. The substrate processing apparatus according to claim 1, wherein the first shield includes a ring-shaped portion.

3. The substrate processing apparatus according to claim 1, wherein the substrate processing apparatus comprises a sputtering processing apparatus for performing a sputtering process for the substrate.

4. The substrate processing apparatus according to claim 3, wherein the gas introduction unit comprises a reactive gas introduction unit configured to introduce a reactive gas to the outer space, and the reactive gas is introduced into the process space via the gap between the first shield and the second shield.

5. A substrate processing apparatus wherein comprising:
a process chamber;
a substrate holder having a substrate holding surface configured to hold a substrate in the process chamber, the substrate holder being capable of being driven along a driving direction perpendicular to the substrate holding surface;
a first shield provided on a peripheral portion of the substrate holder; and
a second shield provided inside the process chamber,
wherein the first shield includes, at a peripheral portion thereof, a cylindrical portion extending in a direction parallel to the driving direction, and the second shield includes a concave portion,
an internal space of the process chamber is partitioned into an outer space and a process space to process the substrate by at least the first shield, the second shield, and the substrate holder,
a relative position of the first shield and the second shield changes when the substrate holder is driven in the driving direction, and the first shield and the second shield form a gap therebetween, the gap including a minimum gap portion having a minimum size in a direction perpendicular to the driving direction, the minimum gap portion being formed by an outer side surface of the cylindrical portion of the first shield and an inner side surface of the second shield, a length of the minimum gap portion in the direction parallel to the driving direction does not change when the substrate holder is driven in the driving direction and the relative position of the first shield and the second shield changes, and the substrate holder is driven in the driving direction within a range in which an inner side surface of the cylindrical portion of the first shield does not face an inner side surface of the concave portion of the second shield.

6. A substrate processing apparatus comprising:
a process chamber;
an exhaust unit configured to exhaust gas from the process chamber;
a gas introduction unit configured to introduce a gas into the process chamber;
a substrate holder having a substrate holding surface configured to hold a substrate in the process chamber, the substrate holder being capable of being driven along a driving direction perpendicular to the substrate holding surface;
a first shield provided on a peripheral portion of the substrate holder; and
a second shield provided inside the process chamber,
wherein the first shield includes, at a peripheral portion thereof, a cylindrical portion extending in a direction parallel to the driving direction, and a projecting portion that extends in a direction parallel to the substrate holding surface to project toward the second shield,
an internal space of the process chamber is partitioned into an outer space and a process space to process the substrate by at least the first shield, the second shield, and the substrate holder,
a relative position of the first shield and the second shield changes when the substrate holder is driven in the driving direction,
the first shield and the second shield are provided so as not to make a linear path from a center of the process space to the outer space exist,
the first shield and the second shield form a gap therebetween, the gap including a minimum gap portion having a minimum size in a direction perpendicular to the driving direction, the minimum gap portion being formed by an outer side surface of the projecting portion and an inner side surface of the second shield,
a length of the minimum gap portion in the direction parallel to the driving direction does not change when the substrate holder is driven in the driving direction and the relative position of the first shield and the second shield changes.

7. A substrate processing apparatus comprising:
a process chamber;
an exhaust unit configured to exhaust gas from the process chamber;
a gas introduction unit configured to introduce a gas into the process chamber;
a substrate holder having a substrate holding surface configured to hold a substrate in the process chamber, the substrate holder being capable of being driven along a driving direction perpendicular to the substrate holding surface;
a first shield provided on a peripheral portion of the substrate holder; and
a second shield provided inside the process chamber,
wherein the second shield includes a cylindrical portion, and the first shield includes a concave portion having a concave shape in a cross-section of a plane including a central axis of the substrate holder,
a lower end of the cylindrical portion of the second shield faces a bottom surface of the concave portion of the first shield,
the first shield further includes a projecting portion that extends in a direction parallel to the substrate holding surface to project toward an outer side surface of the second shield,
an internal space of the process chamber is partitioned into an outer space and a process space to process the substrate by at least the first shield, the second shield, and the substrate holder,
a relative position of the first shield and the second shield changes when the substrate holder is driven in the driving direction,
the first shield and the second shield are provided so as not to make a linear path from a center of the process space to the outer space exist,
the first shield and the second shield form a gap therebetween, the gap including a minimum gap portion having a minimum size in a direction perpendicular to the driving direction, the minimum gap portion being formed by an inner side surface of the projecting portion of the first shield and the outer side surface of the cylindrical portion of the second shield, and
a length of the minimum gap portion in the direction parallel to the driving direction does not change when the substrate holder is driven in the driving direction and the relative position of the first shield and the second shield changes.

8. A substrate processing apparatus comprising:
a process chamber;
an exhaust unit configured to exhaust gas from the process chamber;
a gas introduction unit configured to introduce a gas into the process chamber;
a substrate holder having a substrate holding surface configured to hold a substrate in the process chamber, the substrate holder being capable of being driven along a driving direction perpendicular to the substrate holding surface;
a first shield provided on a peripheral portion of the substrate holder;
a second shield provided inside the process chamber; and
a third shield connected to an end portion of the substrate holder and extending in a direction parallel to the driving direction,
an internal space of the process chamber is partitioned into an outer space and a process space to process the substrate by at least the first shield, the second shield, and the substrate holder,
a relative position of the first shield and the second shield changes when the substrate holder is driven in the driving direction,
the first shield and the second shield are provided so as not to make a linear path from a center of the process space to the outer space exist,
the second shield and the third shield form a gap therebetween, the gap including a minimum gap portion having a minimum size in a direction perpendicular to the driving direction, the minimum gap portion being formed by the third shield and the inner side surface of the second shield, and
a length of the minimum gap portion in the direction parallel to the driving direction does not change when the substrate holder is driven in the driving direction and the relative position of the first shield and the second shield changes.

* * * * *